(12) United States Patent
Kang et al.

(10) Patent No.: US 8,994,061 B2
(45) Date of Patent: Mar. 31, 2015

(54) LIGHT EMITTING DIODE PACKAGE

(75) Inventors: Do Hyoung Kang, Ansan (KR); Oh Sug Kim, Ansan (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 140 days.

(21) Appl. No.: 13/410,399

(22) Filed: Mar. 2, 2012

(65) Prior Publication Data

US 2012/0223343 A1 Sep. 6, 2012

(30) Foreign Application Priority Data

Mar. 2, 2011 (KR) ........................ 10-2011-0018519

(51) Int. Cl.
| | | |
|---|---|---|
| *H01L 33/60* | (2010.01) | |
| *H01L 33/62* | (2010.01) | |
| *H01L 25/075* | (2006.01) | |
| *H01L 25/16* | (2006.01) | |
| *H01L 33/48* | (2010.01) | |

(52) U.S. Cl.
CPC ............ *H01L 33/62* (2013.01); *H01L 25/0753* (2013.01); *H01L 25/167* (2013.01); *H01L 33/486* (2013.01); *H01L 2224/48091* (2013.01); *H01L 2224/48247* (2013.01); *H01L 2224/48257* (2013.01); *H01L 2224/49109* (2013.01)
USPC .......... 257/99; 257/79; 257/88; 257/E33.056; 257/E33.066

(58) Field of Classification Search
USPC ................. 257/98, 99, 88, E33.056, E33.066
See application file for complete search history.

(56) References Cited

U.S. PATENT DOCUMENTS

| | | | | |
|---|---|---|---|---|
| 6,054,716 | A * | 4/2000 | Sonobe et al. ................ 250/552 |
| 8,188,498 | B2 * | 5/2012 | Kim et al. ........................ 257/98 |
| 2008/0316741 | A1 * | 12/2008 | Lee ............................... 362/231 |

* cited by examiner

*Primary Examiner* — Minchul Yang
(74) *Attorney, Agent, or Firm* — H.C. Park & Associates, PLC

(57) ABSTRACT

A light emitting diode package includes a first lead frame comprising a first hole cup, a second lead frame comprising a second hole cup and disposed to face the first lead frame with a gap disposed between the first lead frame and the second lead frame, a first light emitting diode chip disposed on the first hole cup, and a second light emitting diode chip disposed on the second hole cup, the first lead frame comprising a first enlarged region formed between the gap and the first hole cup, and the second lead frame comprising a second enlarged region formed between the gap and the second hole cup.

4 Claims, 2 Drawing Sheets

LIGHT EMITTING DIODE PACKAGE

CROSS-REFERENCE TO RELATED APPLICATION

This application claims priority from and the benefit of Korean Patent Application No. 10-2011-0018519, filed on Mar. 2, 2011, which is hereby incorporated by reference for all purposes as if fully set forth herein.

BACKGROUND

1. Field

The following description relates to a light emitting diode package, and more particularly, to a more reliable light emitting diode package.

2. Discussion of the Background

Generally, a light emitting diode package may include light emitting diode chips and lead frames to apply power to the light emitting diode chips. The lead frames may be supported by a package body and may be electrically connected to the light emitting diode chips via bonding wires. The package body may serve to support the lead frames, and also to protect the light emitting diode chips received therein.

Conventionally, a light emitting diode package may have a structure, in which a pair of light emitting diode chips is mounted on a pair of facing lead frames.

FIG. 1 is a plan view illustrating a conventional light emitting diode package.

Referring to FIG. 1, lead frame 2a and lead frame 2b are arranged with a linear gap disposed between the two lead frames. Also, the lead frame 2a and lead frame 2b are supported by a package body 4, which may be made of a plastic or other similar material. Light emitting diode chip 6a and light emitting diode chip 6b are mounted on the lead frame 2a and lead frame 2b, respectively. The package body 4 may include a cavity, through which the light emitting diode chip 6a and light emitting diode chip 6b are exposed. Further, the package body 4 may be filled with a light-transmitting encapsulation material, such that light emitted from the light emitting diode chip 6a and/or light emitting diode 6b passes through the encapsulation material.

In a conventional light emitting diode package, one bonding wire w1 may be connected between a first light emitting diode chip 6a on a first lead frame 2a and a second lead frame 2b, and another bonding wire w2 may be connected between a second light emitting diode chip 6b on the second lead frame 2b and the first bonding wire 2a.

A wire bonding region of an insufficient size, which may be formed between inner ends of the light emitting diode chip 6a or light emitting diode chip 6b and the lead frame 2a or lead frame 2b, may provide one or more restrictions in an attempt to reduce the distance between the first light emitting diode chip 6a, and the second light emitting diode chip 6b. However, if a wire bonding region of a sufficient size is not secured between the inner ends of the light emitting diode chip 6a or light emitting diode chip 6b and the lead frame 2a or lead frame 2b, one or more restrictions may be provided in positioning a Zener diode 7.

Application of a technique for forming a hole cup to receive or accommodate a light emitting diode chip on a lead frame to a light emitting diode package may lead to some improvement in luminous efficacy and heat dissipation performance of the light emitting diode package. However, it may be difficult to apply this technique to a conventional light emitting diode package as described above due to limited size of the hole cup, which may be related to a wire bonding region of the lead frame, which may be insufficient in size.

SUMMARY

Exemplary embodiments of the present invention provide a light emitting diode package configured to allow an increase in wire bonding regions of lead frames or a Zener diode mounting region.

Additional features of the invention will be set forth in the description which follows and in part will be apparent from the description, or may be learned by practice of the invention.

Exemplary embodiments of the present invention provide a light emitting diode package including a first lead frame comprising a first hole cup; a second lead frame comprising a second hole cup and disposed to face the first lead frame with a gap disposed between the first lead frame and the second lead frame; a first light emitting diode chip disposed on the first hole cup; and a second light emitting diode chip disposed on the second hole cup, the first lead frame comprising a first enlarged region formed between the gap and the first hole cup, and the second lead frame comprising a second enlarged region formed between the gap and the second hole cup.

Exemplary embodiments of the present invention provide a light emitting diode package including a first lead frame comprising inner end; a second lead frame comprising inner end, the inner ends of the first lead frame and second lead frame are adjacent each other with a gap interposed between the first lead frame and second lead frame; a first light emitting diode chip disposed on the first lead frame; a second light emitting diode chip disposed on the second lead frame, wherein each of the inner ends comprises a leading end and a trailing end connected thereto, the leading end enlarging a wire bonding region, a first bonding wire extends from the first light emitting diode chip to a first wire bonding region, and a second bonding wire extends from the second light emitting diode chip to a second wire bonding region.

Exemplary embodiments of the present invention provide a light emitting diode package including a first lead frame comprising a first hole cup and a first inner end; a second lead frame comprising a second hole cup and a second inner end, with a gap disposed between the first lead frame and the second lead frame; a first light emitting diode chip disposed on the first hole cup; and a second light emitting diode chip disposed on the second hole cup, the inner ends comprising a first portion disposed along a first line and a second portion disposed along a second line, the first line not being in parallel with the second line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF ILLUSTRATED EMBODIMENTS

Figure 1:
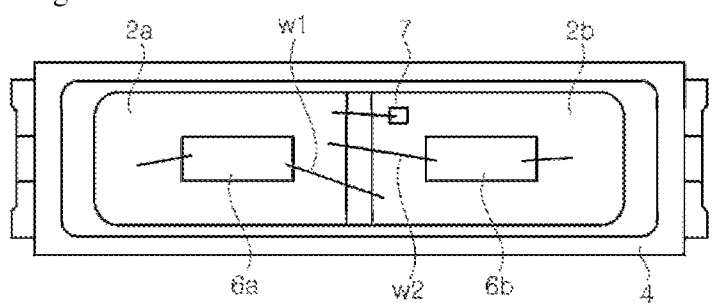
FIG. 1 is a plan view illustrating a conventional light emitting diode package.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

Figure 2:
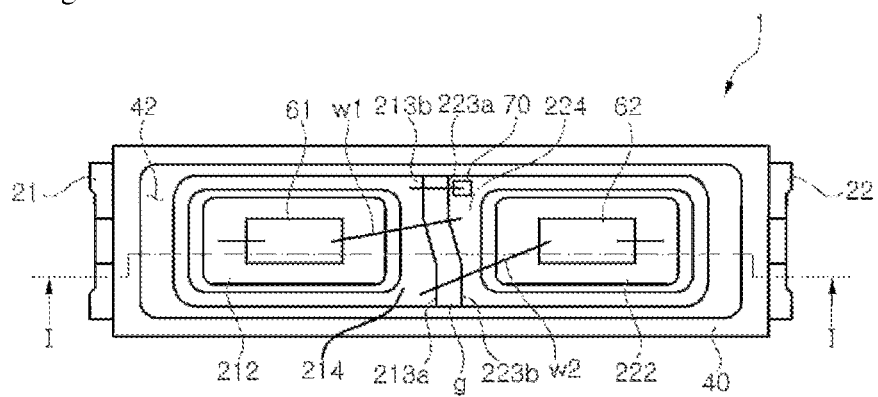
FIG. 2 is a plan view illustrating a light emitting diode package according to an exemplary embodiment of the invention.
Figure 3:
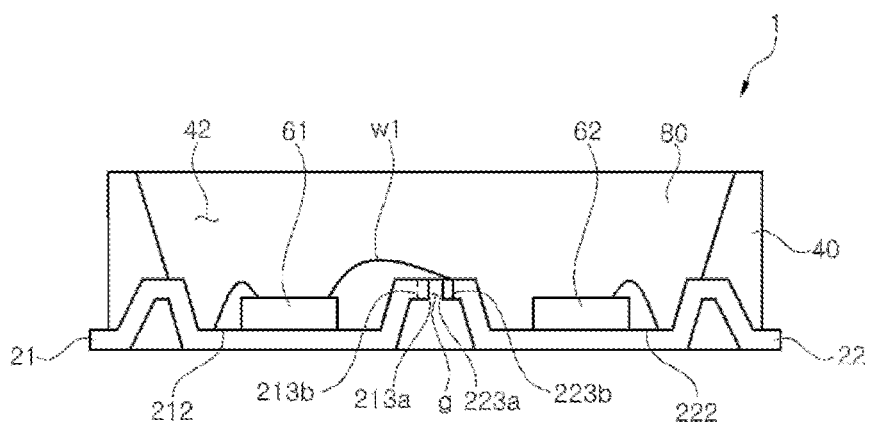
FIG. 3 is a cross-sectional view of a light emitting diode package according to an exemplary embodiment of the invention.

FIG. 2 is a plan view illustrating a light emitting diode package according to an exemplary embodiment of the invention. FIG. 3 is a cross-sectional view of a light emitting diode package according to an exemplary embodiment of the invention.

As shown in FIG. 2 and FIG. 3, a light emitting diode package 1 includes a first lead frame 21, a second lead frame 22, and a package body 40. The package body 40 may support the first lead frame 21, the second lead frame 22, a first light emitting diode chip 61, and a second light emitting diode chip 62. In an example, the package body 40 may be rectangular in shape, but is not limited thereto. The first light emitting diode chip 61 and the second light emitting diode chip 62 may receive power from the first lead frame 21 and the second lead frame 22, respectively, to emit light.

The package body 40 may be formed of a plastic resin, such as polyphthalamide (PPA) or the like, via an injection molding process. The package body 40 may support the first lead frame 21 and the second lead frame 22. Further, the package body 40 with a cavity 42 formed therein may be formed over the first lead frame 21 and second lead frame 22. In an example, the cavity 42 may have an elongated rectangular shape. Upper surfaces of the first lead frame 21 and the second lead frame 22 may be regionally exposed through the cavity 42. Within the cavity 42, the first light emitting diode chip 61 and the second light emitting diode chip 62 may be mounted on the first lead frame 21 and the second lead frame 22, respectively. A light transmitting encapsulation material 80 (see FIG. 3) may fill the cavity 42 to protect the first light emitting diode chip 61 and the second light emitting diode chip 62.

The first lead frame 21 and the second lead frame 22 may extend through opposite sides of the package body 40 to form external terminals of the light emitting diode package 1. Further, parts of external portions of the first lead frame 21 and the second lead frame 22 constituting the external terminals may be bent at least in part, to be coplanar with a bottom surface of the package body 40.

Inside the cavity 42 of the package body 40, the first frame 21 and the second lead frame 22 may be separated from each other to define or dispose a gap (g) located between the two lead frames. In addition, the first lead frame 21 and the second lead frame 22 may be formed with a first hole cup 212 and a second hole cup 222, respectively. The first light emitting diode chip 61 may be placed on the first hole cup 212 and the second light emitting diode chip 62 may be placed on the second hole cup 222. One or both of the first hole cup 212 and the second hole cup 222 may have a rectangular shape, which may be elongated along the length of the cavity 42. More specifically, the first hole cup 212 and second hole cup 222 may have a shape with some sides being longer than the other sides. Further, interior walls of the first hole cup 212 and the second hole cup 222 may have slanted or angular surfaces to improve reflectivity. Further, bottom surfaces of the first hole cup 212 and the second hole cup 222 may be exposed to the outside and coplanar at least in part with the bottom surface of the package body 40.

Further, a gap (g) may have a bent shape or other similar shapes (e.g., a thunderbolt shape), which may divide the inner ends of the first lead frame 21 and second lead frame 22 into a leading end 213a or a leading end 223a and a trailing end 213b or a trailing end 223b. One or more trailing ends may connect to the one or more leading ends. More specifically, the leading end 213a may be connected to the trailing end 213b. The leading end 213a or the leading end 223a may protrude from the corresponding lead frame 21 or the lead frame 22 towards the other lead frame 22 or lead frame 21 beyond the trailing end 213b or the trailing end 223b. The leading end 213a of the first lead frame 21 may adjacently face the trailing end 223b of the second lead frame 22, and the trailing end 213b of the first lead frame 21 may adjacently face the leading end 223a of the second lead frame 22.

The leading end 213a or the leading end 223a may enlarge an area of a region to a reference size or a sufficient size near the leading end 213a or the leading end 223a over an area of the other end. Accordingly, an enlarged region of a reference size or a sufficient size may be provided as a wire bonding region to which a bonding wire W1 or a bonding wire W2 extending from the light emitting diode chip 61 or the light emitting diode chip 62 may be bonded. Thus, it may be possible to secure an enlarged wire bonding region of a reference size near the inner ends of the first lead frame 21 and the second lead frame 22 without increasing a distance between the first light emitting diode chip 61 and the second light emitting diode chip 62.

Further, the first lead frame 21 may include a first enlarged region 214 formed between the first hole cup 212 and the gap (g). Also, the second lead frame 22 may include a second enlarged region 224 formed between the second hole cup 222 and the gap (g). Further, the first enlarged region 214 and the second enlarged region 224 may be of a reference size or a sufficient size, which may be a larger than other regions adjacent thereto. More specifically, the first enlarged region 214 may be formed between the first hole cup 212 of the first lead frame 21 and the leading end 213a of the first lead frame 21. The second enlarged region 224 may be formed between the second hole cup 222 of the second lead frame 22 and the leading end 223a of the second lead frame 22. One end of a bonding wire W2 extending from the second light emitting diode chip 62 on the second lead frame 22 may be bonded to the first enlarged region 214. One end of a bonding wire W1 extending from the first light emitting diode chip 61 on the first lead frame 21 may be bonded to the second enlarged region 224. A Zener diode 70 may be mounted on the second enlarged region 224.

A wire bonding region that is smaller than a reference size or of an insufficient size on the lead frame may provide lower reliability in a wire bonding operation. According to exemplary embodiments of the invention, although the hole cup 212 or the hole cup 222 may occupy an area on the lead frame 21 or the lead frame 22, which may not allow wire bonding thereto, the provision of the first enlarged region 214 and second enlarged region 224 as described above may secure wire bonding regions of a reference size or a sufficient size. In addition, the provision of the first enlarged region 212 and second enlarged region 214 may increase the sizes of the first hole cup 212 and second hole cup 222 to at least that of a reference size and at least partially overlap the existing hole cups. An increase in the sizes of the hole cups may lead to improvement of luminous efficacy of the light emitting diode package.

Although the first enlarged region 214 and the second enlarged region 224 are illustrated as being arranged in a diagonal direction as shown in FIG. 2, it will be understood that the first enlarged region 214 and the second enlarged region 224 may be arranged in various ways.

Figure 4:
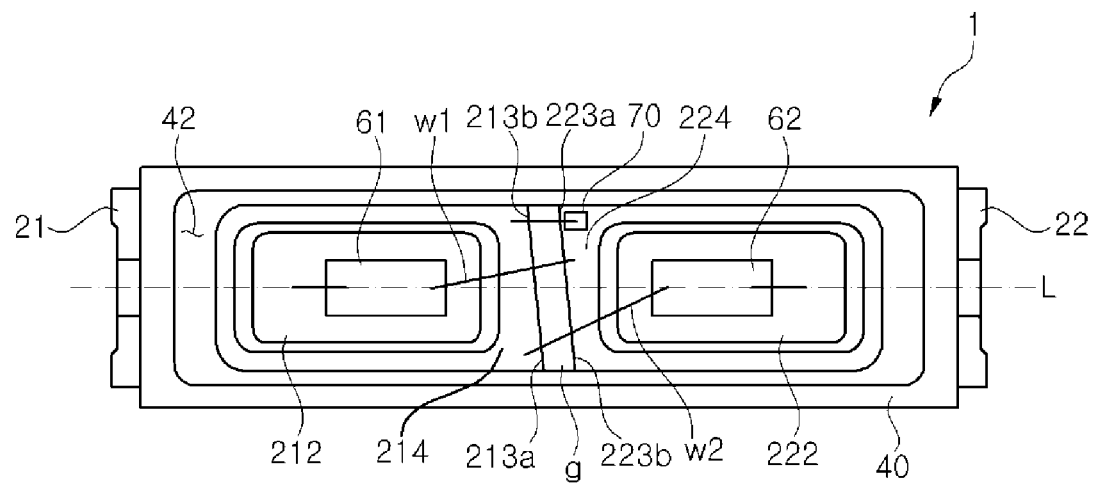
FIG. 4 is a plan view illustrating a light emitting diode package according to an exemplary embodiment of the invention.

FIG. 4 is a plan view illustrating a light emitting diode package according to an exemplary embodiment of the invention.

Referring to FIG. 4, a first lead frame 21 and a second lead frame 22 may be separated from each other by a gap (g) disposed between the two lead frames. The gap (g) may have an inclined or an angular line shape. The gap (g) may be positioned between inner ends of the first lead frame 21 and the second lead frame 22. One or more of the inner ends of the first lead frame 21 and second lead frame 22 may have a leading end 213a or a leading end 223a and a trailing end 213b or a trailing end 223b. In an example, the leading ends and the trailing ends may not be distinguished from each other since the gap (g) and the inner ends may be present on a continuously straight line. However, the leading end 213a or the leading end 223a and the trailing end 213b or the trailing end 223b may be distinguished from each other with reference to an imaginary reference line L crossing the center of the light emitting diode package 1 in a lateral direction.

Further, the leading end 213a or leading end 223a may protrude from the corresponding lead frame 21 or lead frame 22 towards the other lead frame 22 or lead frame 21 beyond the trailing end 213b or trailing end 223b. The leading end 213a of the first lead frame 21 may adjacently face the trailing end 223b of the second lead frame 22, and the trailing end 213b of the first lead frame 21 may adjacently face the leading end 223a of the second lead frame 22.

In addition, with reference to the reference line L, a first enlarged region 214 may be formed between the first hole cup 212 of the first lead frame 21 and the leading end 213a of the first lead frame 21. Also, a second enlarged region 224 may be formed between the second hole cup 222 of the second lead frame 22 and the leading end 223a of the second lead frame 22. One end of a bonding wire W2 extending from the second light emitting diode chip 62 on the second lead frame 22 may be bonded to the first enlarged region 214, and one end of a bonding wire W1 extending from the first light emitting diode chip 61 on the first lead frame 21 may be bonded to the second enlarged region 224. A Zener diode 70 may be mounted on the second enlarged region 224. The first enlarged region 214 and second enlarged region 224 may be of a reference size.

The light emitting diode package may allow an increase in wire bonding regions corresponding to lead frames or a Zener diode mounting region. In an example, the wire bonding regions may be increased to that of at least a reference size or a sufficient size. Further, the light emitting diode package may allow the increase in wire bonding regions without increasing the distance between light emitting diode chips mounted on adjacent lead frames. In addition, the light emitting diode package may allow an increase in wire bonding regions for lead frames or a Zener diode mounting region without decreasing the size of hole cups in application of the hole cups to adjacent lead frames.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light emitting diode package, comprising:
a first lead frame comprising a first hole cup;
a second lead frame comprising a second hole cup and disposed to face the first lead frame with a gap disposed between the first lead frame and the second lead frame;
a first enlarged region formed between the gap and the first hole cup;
a second enlarged region formed between the gap and the second hole cup;
a first light emitting diode chip disposed on the first hole cup;
a second light emitting diode chip disposed on the second hole cup;
a first bonding wire contacted with the first light emitting diode chip;
a second bonding wire contacted with the second light emitting diode chip; and
a Zener diode disposed in the second enlarged region,
wherein the first bonding wire extends from the first light emitting diode chip to the second enlarged region,
wherein the first hole cup is spaced apart from the second hole cup,
wherein the first and second lead frames further comprise:
first and second ends, respectively, disposed outside the package body and having surfaces parallel to the lower surface of the first and second hole cups,
wherein the first and second lead frames further comprise first and second upper surfaces surrounding each of the first and second hole cups, respectively,
wherein each of first and second upper surfaces are parallel to each other and each of the first and second enlarged regions, and
wherein each of the first upper surface, the second upper surface, the first enlarged region, and the second enlarged region are at least partially covered by a light transmitting encapsulation material.

2. The light emitting diode package of claim 1, wherein the first enlarged region and the second enlarged region are formed to correspond to an inclined line shape of the gap.

3. The light emitting diode package of claim 1, wherein the second bonding wire extends from the second light emitting diode chip to the first enlarged region.

4. The light emitting diode package of claim 1, wherein the first enlarged region faces the second enlarged region in a diagonal direction.

* * * * *